US006885793B2

(12) United States Patent
Macomber

(10) Patent No.: US 6,885,793 B2
(45) Date of Patent: Apr. 26, 2005

(54) CLEAVING LASER DIODE BARS HAVING GRATINGS

(75) Inventor: Steven Henry Macomber, Tucson, AZ (US)

(73) Assignee: Spectra Physics, INC, Tucson, AZ (US)

( * ) Notice: Subject to any disclaimer, the term of this patent is extended or adjusted under 35 U.S.C. 154(b) by 3 days.

(21) Appl. No.: 10/458,469

(22) Filed: Jun. 10, 2003

(65) Prior Publication Data

US 2004/0252942 A1 Dec. 16, 2004

(51) Int. Cl.[7] .................................................. G02B 6/34
(52) U.S. Cl. .......................... 385/37; 385/31; 385/131; 385/132; 372/96; 372/102
(58) Field of Search .............................. 385/37, 31, 131, 385/132, 147; 372/45, 96, 19, 102

(56) References Cited

U.S. PATENT DOCUMENTS

| | | | | |
|---|---|---|---|---|
| 4,849,985 | A | * | 7/1989 | Yoshida et al. ............... 372/96 |
| 5,337,328 | A | * | 8/1994 | Lang et al. .................... 372/45 |
| 2003/0231689 | A1 | * | 12/2003 | Vurgaftman et al. .......... 372/96 |
| 2004/0131099 | A1 | * | 7/2004 | Thiyagarajan ............... 372/45 |

OTHER PUBLICATIONS

Bewley, W. W. et al, Limitations to beam quality of mid–infrared angled–grating distributed–feedback lasers, IEEE J. on Selected Topics in Quantum Electronics, vol. 7, No. 2, Mar.–Apr. 2001, pp. 96–100.

Sarangan, Andrew M. et al, "Spectral Properties of Angled–Grating High Power Semiconductor Lasers", IEEE J. Quantum Electronics, vol. 35, No. 8, Aug. 1999, pp. 1220–1230.

Glinski, Jan, et al, "Yield Analysis of Second–Order DSM DFB Lasers and Implications for Design", IEEE J. Quantum Electronics, vol. QE–23, No. 6, Jun. 1987, pp. 849–858.

Matsuoka, T., et al, "Dependence of Single–Longitudinal Mode Probability on DFB Laser Facet Structure", Electronics Letters, Nov. $21^{st}$, 1985, vol. 21, No. 24, pp. 1151–1152.

Streifer, W., et al, "Effect of External Reflectors on Longitudinal Modes of Distributed Feedback Lasers", IEEE J. Quantum Electronics, vol.. QE–11, No. 4, Apr. 1975, pp. 154–161.

Chinn, S., "Effects of Mirror Reflectivity in a Distributed Feedback Laser", IEEE J. Quantum Electronics, vol..QE–9, No. 6, Jun. 1973, pp. 574–580.

* cited by examiner

Primary Examiner—Fayez G. Assaf
(74) Attorney, Agent, or Firm—Howard R. Popper

(57) ABSTRACT

A wafer that is cleaved to provide a facet for a Fabry-Perot cavity is provided with Bragg gratings whose axes are offset by a small angle from the axis of the Fabry Perot cavity to offset the effect of the randomly uncontrollable location of the cleaved facet on the optical phase of the grating feedback.

6 Claims, 2 Drawing Sheets

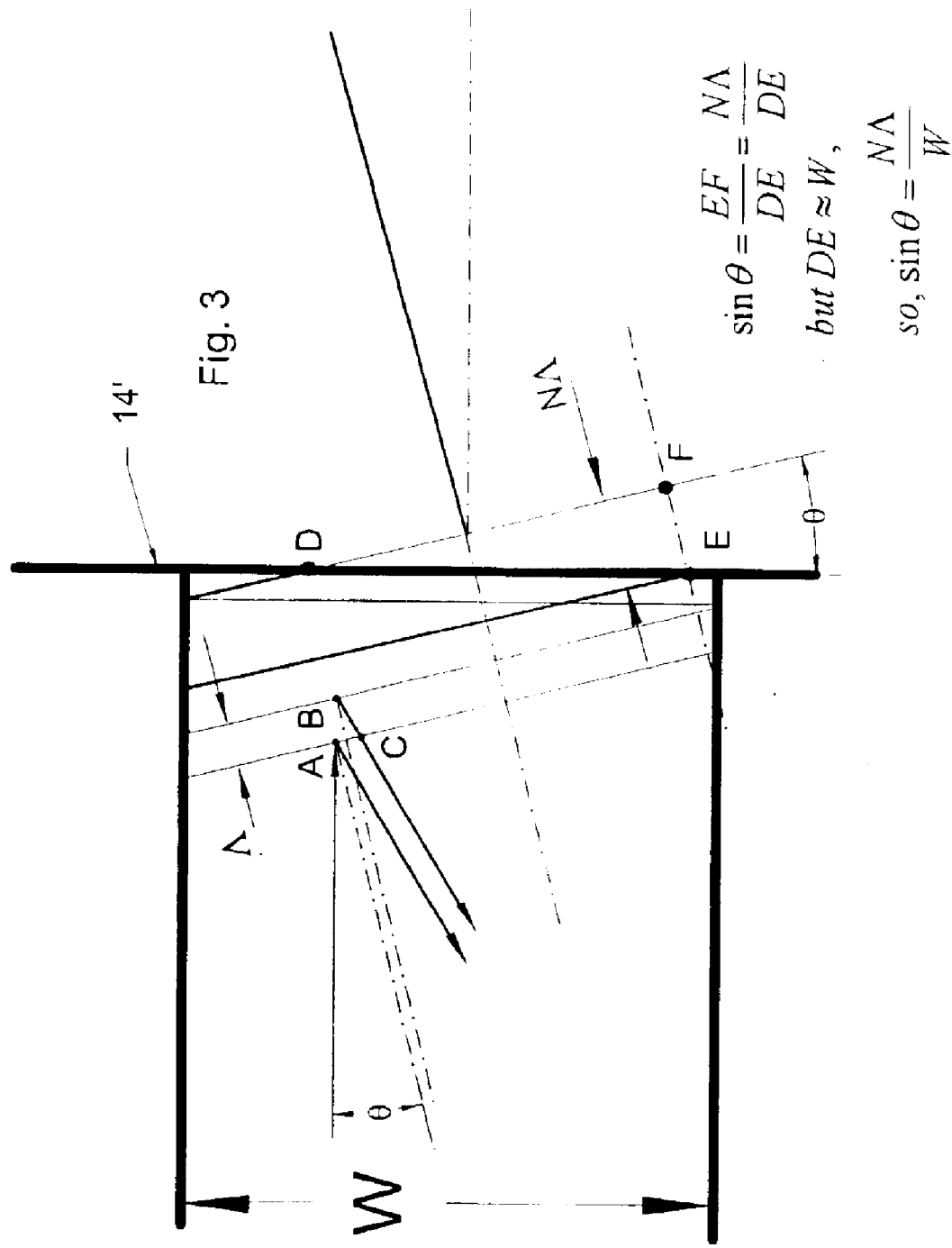

CLEAVING LASER DIODE BARS HAVING GRATINGS

FIELD OF THE INVENTION

This invention relates to improving the reproducibility of laser bars having gratings and, more particularly, to providing a grating that it will be immune to the random phase variation occuring when cleaving the facet of a Fabry-Perot cavity.

BACKGROUND OF THE PRIOR ART

Gratings are embedded in laser diode structures to stabilize the lasing wavelength. The distributed Bragg reflector (DBR) grating laser devices have gratings outside of the gain (electrically pumped) region while distributed feedback (DFB) grating devices have a grating within the gain region. In the conventional process, a grating is created in an exposed p-doped cladding layer of a semiconductor wafer. The cladding layer is coated with photoresist and exposed to the interference pattern from two plane waves of ultra-violet or blue light, which produce the desired diffraction pattern on the resist. The perodicity of the interference pattern can be precisely adjusted by setting the angles of incidence of the two beams. The photoresist is developed and etchants are applied to transfer the grating that was exposed in the photoresist into the surface of the cladding layer. If the grating is to be in the pumped region, epitaxial layers are regrown over the grating. If the grating is to lie outside of the pumped region, the overgrowth is unecessary and a simple insulating layer of SiO2 can be used to protect the surface. After the grating and other wafer processing is completed, the wafer bar must be cleaved to provide mirror facets that define the Fabry-Perot cavity.

Cleaving is performed by mechanically scribing the wafer with a precision instrument. Such instruments can only locate the scribe line to within ~10 microns. However, the actual location of the facet is determined by the crystal plane of the wafer which is closest to the scribe line. By comparison, the light wavelength $\lambda$ inside the laser is less than one micron. For example, a 808 nm, diode laser with an index of refraction of ~3.3 has a wavelength inside the diode of ~240 nm (0.24 microns). Thus, the distance between the cleaved facet and the grating grooves is essentially a random number of waves. The uncontrolled phase between the grating and facet leads to unwanted spectral variation from laser to laser.

For a grating to stabilize the wavelength $\lambda$ of emitted light, the lines of the grating should be separated from each other by a distance $\Lambda=\lambda/n$, where n is the cladding layer's index of refraction, n. For example, if $\lambda$=880 nm, $\Lambda$=880/3.3 or only about 240 nm. The cleaved facet should be located to within a small fraction of $\Lambda$ from the first grating line, say 10% of $\Lambda$. A larger error in the "z" axis position of the cleaved facet may cause a reflection that will make the grating's effectiveness less than optimal. If the facet is cleaved so that the spacing between the grating and the cleaved facet is at an odd multiple of the half wavelength $\Lambda/2$, the grating will not stabilize the laser bar's light wavelength. The uncontrolled phase between the grating and facet will lead to unwanted spectral variations and therefor lower the effective yield of lasers cleaved from the wafer. Low yields are especially unacceptable in the manufacture of high-power laser bars.

SUMMARY OF THE INVENTION

We have discovered that instead of providing a grating whose axis is parallel to the axis of the Fabry Perot cavity, the grating axis should be tilted by a small angle $\theta$ from the longitudinal z-axis of the gain stripe so that the facet will intercept a small number N of the offset grating lines. When the grating lines are offset, the somewhat indeterminate location of the cleaved facet will vary the optical phase of the feedback by a few waves across the width of the gain stripe, shifting the lateral location where the grating and facet are in phase, but having little effect on the feedback averaged over the stripe width. Thus, the randomly uncontrollable location of the cleaved facet will cause much less spectral variation among a production run of lasers.

BRIEF DESCRIPTION OF THE DRAWING

The foregoing objects and features may become more apparent from the ensuing description when read together with the drawing in which:

FIG. 3 is an enlarged view of the gain stripe area of the offset grating showing the geometric relationships for establishing the size of the offset angle.

DESCRIPTION

Figure 1:
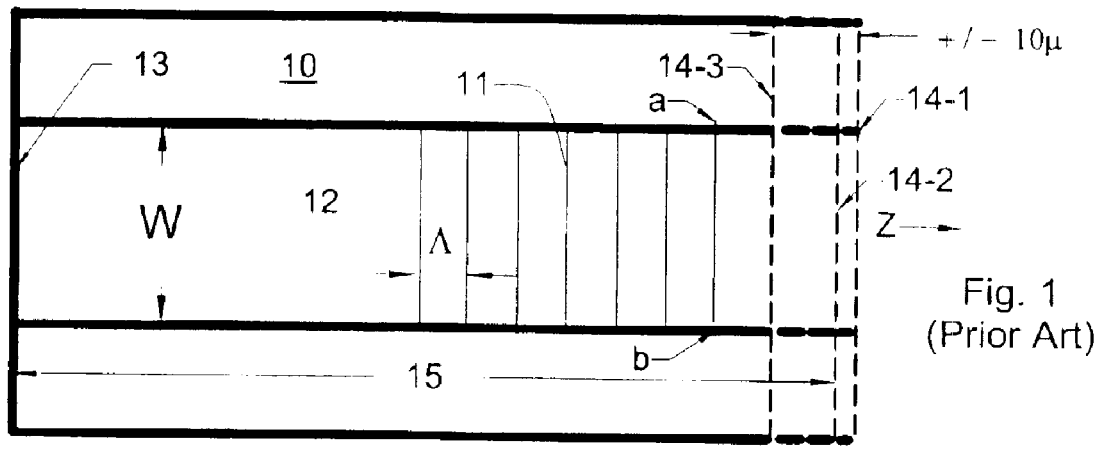
FIG. 1 shows a prior art laser bar having an embedded grating whose axis is aligned with the longitudinal axis of the Fabry-Perot cavity.

FIG. 1 shows a top view of a conventional laser bar 10 that has a gain stripe of width W. A grating 11 is embedded in a cladding layer 12 having a refractive index of n. Facets 13, 14 are cleaved at opposite ends of the bar to define a Fabry-Perot cavity of length 15 which will cause the laser to emit light at a wavelength of $\lambda$. The light wavelength is stabilized by using a grating 11 whose lines are a distance $\Lambda=\lambda/n$ apart, where $\Lambda$ is the wavelength within the cladding layer 12 and n is the index of refraction of the cladding layer 12. It is important that facet 14 be cleaved so that it is distant from the first grating line a-b by an even multiple of $\Lambda$, as otherwise the grating cannot be relied upon to stabilize the radiation wavelength $\lambda$.

Unfortunately, it is not possible to definitively locate facet 14 by cleaving the wafer because the facet location is a function not only of the location of the scribed line but also of the location of the nearest crystal plane. Thus, depending on the crystal lattice, facet 14 may occur at any of positions 14-1, 14-2, or 14-3. If the cleaved facet is located at position that happens to be one wavelength $\lambda$ (or an even number m of wavelengths m$\lambda$) from grating line a–b, the facet and the grating will be in the proper phase to provide feedback to stabilize light at the wavelength $\lambda$. If the cleaved facet is located at position 14-3 which happens to be an odd number k of half-wavelengths k$\Lambda$/2 from grating line a–b, the facet and the grating 11 will be exactly out of phase and no stabilizing effect will be obtained. If the cleaved facet is located at an intermediate position 14-2, feedback will be present but will not be as effective as the feedback produced by a facet at location 14-1. Since a production run of cleaved wafers will differ as to the location of their facets, there will be an undesirable variation in wavelength stability among laser produced from these wafers. It would be desirable to be able to cleave the facets to within an accuracy within ±1% of $\Lambda$. For example, if $\Lambda$ is 200 nm, this equates to the need to position the cleavage facet to within an accuracy of ±2 nm with respect to the crystal lattice, an accuracy which is well beyond the capabilities of even the most sophisticated production machinery.

Figure 2:
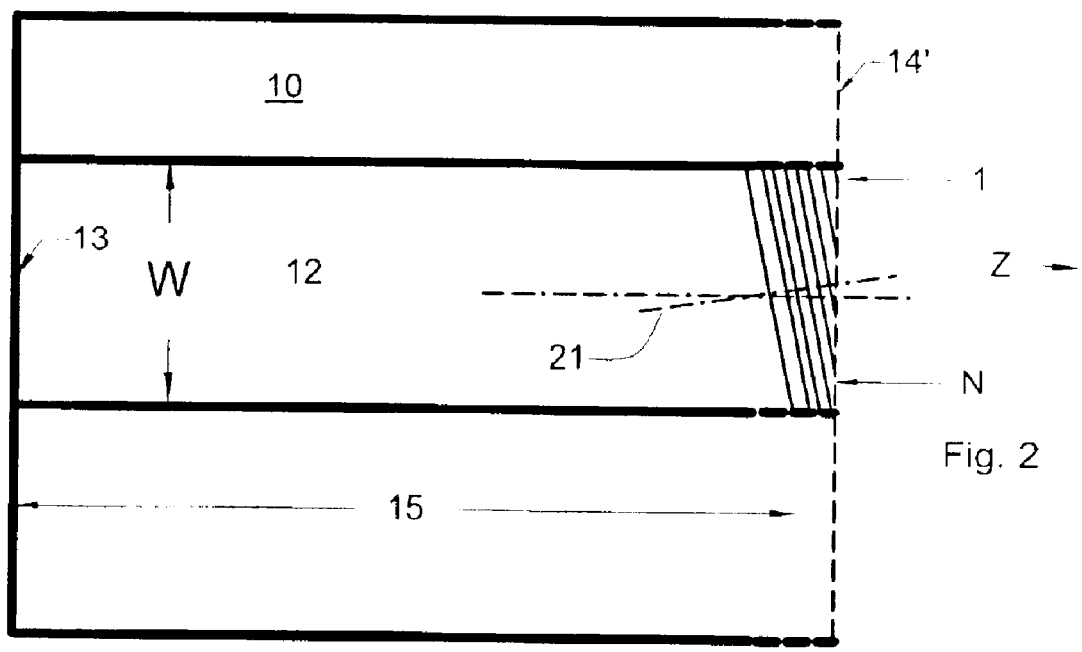
FIG. 2 shows the manner of offsetting the grating axis from the z-axis of the Fabry-Perot cavity by a small angle in accordance with the invention.

In accordance with the principles of the present invention, the effect of being unable to control the exact location of the cleaved facet with respect to the grating lines is alleviated. Referring to FIG. 2, the cleaved facet is located at 14' which corresponds to any of the indeterminate locations 14-1, 14-2 or 14-3 of FIG. 1. However, in FIG. 2, the axis of Bragg grating 21 is offset by a small angle θ from the longitudinal axis of the Fabry-Perot cavity so that the width of the stripe W at the right-hand facet intercepts a small number N of grating lines that are spaced A apart from one another. The point at which the right-hand facet 14' intercepts the first of the N grating lines is labeled "D". The point at which facet 14' intercepts the last of the N grating lines is labeled "E". It is important to bear in mind that the wafer will normally contain more than N grating lines, but facet 14' will intercept only N of them. Although grating 21 is depicted as a series of straight lines in order to simplify the drawing, it should be appreciated that gratings can be produced with various cross-sections depending on the chemical etchants, etc., that are used.

To show things somewhat better, the region at the right hand side of FIG. 2 is shown in greater detail in FIG. 3. The grating lines are spaced apart from one another by the distance Λ so that the gain stripe width W intercepts N of then at facet 14'. Angle θ is chosen such that the first of the N grating lines intercepts facet 14' at point D and the Nth grating line intercepts facet 14' at point E.

For the triangle at facet 14' the angle θ is determined from:

$$\sin\theta = \frac{EF}{DE} = \frac{N\Lambda}{DE}$$

but $DE \approx W$, so, $\sin\theta = \frac{N\Lambda}{W}$

Since constructive reflections occur at each of the N grating lines intercepted by facet 14' grating 21 provides feedback which averages out at some value other than zero, regardless of the indeterminate location at which of facet 14' has been cleaved.

As an example, for a laser producing light at a wavelength of λ=880 nm in which grating 21 is located in a cladding layer 12 whose index of refraction n=3.5, the grating wavelength Λ should be λ/n=880/3.5=251 nm. If the wafer has a gain stripe width W=100μ and facet 14 intercepts N=2 grating wavelength lines, the grating axis should make an angle θ to the "z" axis such that:

$$\sin\theta = \theta = \frac{N\Lambda}{W} = \frac{2 \cdot 251 \cdot 10^{-9}}{100 \cdot 10^{-6}} = 5.02 \text{ (radians)} = 0.3°$$

The advantage of offsetting the grating axis from the "z" axis of the Fabry-Perot cavity by the angle θ is that the facet may be cleaved to within a commercial accuracy of approximately ±10 μ and yet the grating will provide adequate wavelength stabilizing feedback because the tilt of the grating lines allows the error in location to be averaged over the width of gain stripe W. This increases the commercial reproducibility of laser bars having gratings.

There is a limit to how large the offset angle θ can be made. If angle θ is too large, the grating feedback reflection will not couple into the lateral field of the laser. The lateral optical field inside a wide-stripe semiconductor laser consists of a superposition of many modes that produce a distribution of angular components. As measured outside the laser, the lateral far field has intensity out to a maximum angle of +/−5 degrees. The maximum angle is approximately +/−1.5 degrees. The feedback from the grating needs to be coupled into these modes. Feedback from the grating can be thought of as weak reflections from each grating groove. The angle causes the reflected feedback to have twice the angle of incidence. Thus, to ensure that there is feedback into the lateral field, the angle θ should be much less than ~0.75 degrees. In fact, the N=2 case above is about as large as is permissible.

What has been described is deemed to be illustrative of the principles of the invention. Further and other modifications will be apparent to those in the art and may be made without however departing from the spirit and scope of the invention.

What is claimed is:

1. A semiconductor wafer having a gain stripe defining the longitudinal axis of a Fabry Perot cavity, a facet cleaved perpendicularly to said axis, the combination comprising:

a grating having lines spaced Λ apart embedded in a cladding layer of said wafer:

the axis of said grating being offset from the longitudinal axis of said cavity by a small angle θ, where θ=NΛ/W, where N is a small integer, said angle θ is greater than 0 and less than 1 degree and W is the width of said gain stripe.

2. A semiconductor wafer according to claim 1 in which said facet intercepts N of said grating lines.

3. A semiconductor wafer according to claim 2 wherein said facet width intercepts said N grating lines.

4. A semiconductor wafer cleavable to form mirror facets defining a Fabry-Perot cavity, an arrangement for compensating for inaccuracy in cleaving said facet: comprising a grating of wavelength of Λ embedded in a cladding layer of said wafer beneath a gain stripe having a width W; the axis or said grating being tilted with respect to the axis of said gain stripe by a small angle θ, where θ=NΛ/W, N being a small integer, said angle θ being greater than 0 and less than 1 degree.

5. A semiconductor wafer having a gain stripe defining the axis of Fabry-Perot cavity, the improvement comprising:

a grating embedded in a cladding layer of said wafer for providing feedback at a wavelength determined by the spacing of said grating and the index of refraction of said cladding layer, said grating being offset a small angle to the axis of said Fabry-Perot cavity; and a facet cleaved at right angles to the axis of said cavity, said angle being sufficient to average the feedback provided by said grating over the width of said gain stripe, thereby overcoming the random variation in distance between said cleaved facet and said grating.

6. A semiconductor wafer according to claim 5 wherein said cleaved facet intercepts a small number of the spaced lines of said grating.

* * * * *